(12) United States Patent
Chung et al.

(10) Patent No.: US 8,443,254 B2
(45) Date of Patent: May 14, 2013

(54) METHOD OF GENERATING A PARITY CHECK MATRIX FOR LDPC ENCODING AND DECODING

(75) Inventors: Ji Wook Chung, Anyang-si (KR); Min Seok Oh, Anyang-si (KR); Ki Hyoung Cho, Anyang-si (KR); Seung Hyun Kang, Anyang-si (KR); Ji Ae Seok, Anyang-si (KR); Young Seob Lee, Anyang-si (KR); So Yeon Kim, Anyang-si (KR)

(73) Assignee: LG Electronics Inc., Seoul (KR)

( * ) Notice: Subject to any disclaimer, the term of this patent is extended or adjusted under 35 U.S.C. 154(b) by 791 days.

(21) Appl. No.: 12/531,466

(22) PCT Filed: Mar. 14, 2008

(86) PCT No.: PCT/KR2008/001460
§ 371 (c)(1),
(2), (4) Date: Sep. 15, 2009

(87) PCT Pub. No.: WO2008/114969
PCT Pub. Date: Sep. 25, 2008

(65) Prior Publication Data
US 2010/0050045 A1 Feb. 25, 2010

Related U.S. Application Data

(60) Provisional application No. 60/895,416, filed on Mar. 16, 2007.

(30) Foreign Application Priority Data

Aug. 9, 2007 (KR) .......................... 10-2007-0080362

(51) Int. Cl.
*H03M 13/00* (2006.01)

(52) U.S. Cl.
USPC .......................................... 714/758; 714/781

(58) Field of Classification Search .................. 714/758, 714/781
See application file for complete search history.

(56) References Cited

U.S. PATENT DOCUMENTS

| | | | |
|---|---|---|---|
| 6,633,856 B2 * | 10/2003 | Richardson et al. | 706/15 |
| 7,020,829 B2 | 3/2006 | Eroz et al. | |
| 7,120,856 B2 * | 10/2006 | Zhang et al. | 714/801 |
| 7,260,763 B2 * | 8/2007 | Sukhobok et al. | 714/758 |
| 7,373,581 B2 * | 5/2008 | Okamura et al. | 714/752 |
| 2004/0153938 A1 * | 8/2004 | Okamura et al. | 714/746 |
| 2005/0229087 A1 | 10/2005 | Kim et al. | |
| 2005/0289437 A1 * | 12/2005 | Oh et al. | 714/758 |
| 2006/0107180 A1 | 5/2006 | Kim et al. | |
| 2006/0156183 A1 | 7/2006 | Kim et al. | |

FOREIGN PATENT DOCUMENTS

| | | | |
|---|---|---|---|
| KR | 10-2006-0032807 A | 4/2006 | |
| KR | 10-2006-0061145 A | 6/2006 | |
| KR | 10-2005-0100152 A | 10/2008 | |

* cited by examiner

*Primary Examiner* — Joseph D Torres
(74) *Attorney, Agent, or Firm* — Birch, Stewart, Kolasch & Birch, LLP (57) ABSTRACT

A method of encoding input data using a low density parity check (LDPC) code or decoding the encoded data is disclosed. Each index of a model matrix is expanded to an index matrix which includes two or more indexes. Each index included in the index matrix indicates a specific sub-matrix, and can be replaced with a corresponding sub-matrix to generate a parity check matrix.

10 Claims, 10 Drawing Sheets

METHOD OF GENERATING A PARITY CHECK MATRIX FOR LDPC ENCODING AND DECODING

This application is the National Phase of PCT/KR2008/001460 filed on Mar. 14, 2008 which claims priority under 35 U.S.C. 119(e) to U.S. Provisional Application No. 60/895,416 filed on Mar. 16, 2007 and under 35 U.S.C. 119(a) to Patent Application No. 10-2007-0080362 filed in Korea on Aug. 9, 2007, all of which are hereby expressly incorporated by reference into the present application.

TECHNICAL FIELD

The present invention relates to a method of encoding and decoding, and more particularly, to a method of generating a parity check matrix used when encoding input data or decoding encoded data using a parity density parity check (LDPC) code.

BACKGROUND ART

Generally, encoding means a data processing procedure of a transmitter to allow a receiver to recover original data in spite of any error caused by distortion, loss, etc. of a signal, which are generated when the transmitter transmits data through a communication channel. Decoding means that the receiver recovers the signal, which is encoded and transmitted from the transmitter, to original data.

Recently, a method of encoding data using LDPC code has been highlighted. As most of elements of a parity check matrix H are 0, the LDPC code has been suggested as a linear block code of low density by Gallager in 1962. The LDPC code could not have been implemented by hardware technique at that time due to its complexity. Although the LDPC code has not attracted attention at that time, its excellent performance of the LDPC code has been approved in 1995. Thus, studies of the LDPC code have been actively made since 1995. (References: [1] Robert G. Gallager, "Low-Density Parity-Check Codes", The MIT Press, Sep. 15, 1963, [2] D. J. C. Mackay, Good error-correcting codes based on very sparse matrices, IEEE Trans. Inform. Theory, IT-45, pp. 399-431 (1999))

Since a parity check matrix of the LDPC code has a very small number of elements of 1, decoding can be performed through repetitive decoding even in a very great block size, whereby its performance is approximate to channel capacity limitation of Shannon like turbo code if the block size becomes very great.

The LDPC code can be explained by a parity check matrix H of $(n-k) \times n$. A generator matrix G corresponding to the parity check matrix H can be obtained by the following equation 1.

$$H \cdot G = 0 \quad \text{[Equation 1]}$$

In the method of encoding and decoding using LDPC code, the transmitter encodes input data using the generator matrix G in accordance with the following equation 2, wherein the generator matrix G has a relation of equation 1 with the parity check matrix H.

$$c = u \text{ (wherein, c is a codeword and u is a data frame)} \quad \text{[Equation 2]}$$

As aforementioned, the method of encoding using LDPC code, the parity check matrix H can be regarded as the most important factor. Since the parity check matrix H has a size of 1000×2000 approximately, it requires several operation procedures in the encoding and decoding procedures, its realization is very complicate, and many memory areas are required.

Generally, since adding more weights to the parity check matrix H means that adding more parameters to the parity check equations, better performance can be obtained in the method of encoding and decoding using LDPC code. In this case, weight means the number of elements '1' included in each column or row in the parity check matrix. However, if more weights are added to the parity check matrix H, it is likely to form 4-cycle or 6-cycle in the parity check matrix. In this case, a possibility of danger arises in that complexity in the encoding and decoding procedures using LDPC code may increase and performance may be deteriorated.

The 4-cycle means the case where two rows of the parity check matrix H simultaneously have 1 at two parts, and the 6-cycle means that two rows selected from random three rows have 1 at a single part. When most part of the parity check matrix has 4-cycle or 6-cycle, it means that encoding or decoding performance is likely to be deteriorated.

DISCLOSURE OF THE INVENTION

As described above, in a method of encoding and decoding using LDPC code, how to distribute a weight of each row or column in a parity check matrix and how to control a cycle such as 4-cycle or 6-cycle affects encoding and decoding performance greatly.

Accordingly, the present invention is directed to a method of encoding and decoding using LDPC code, which substantially obviates one or more problems due to limitations and disadvantages of the related art.

An object of the present invention is to provide a method of encoding and decoding using LDPC code, in which encoding and decoding performance can be improved.

Another object of the present invention is to provide a method of encoding and decoding using LDPC code, in which efficient parallel processing can be performed during encoding or decoding by a method of expanding each index included in a model matrix to a 2×2 index matrix of a diagonal type or a cross diagonal type.

Other object of the present invention is to provide a method of encoding and decoding using LDPC code, in which a weight of a row or column and the number of cycles in a parity check matrix can be controlled easily.

To achieve these objects and other advantages and in accordance with the purpose of the invention, as embodied and broadly described herein, in a method of structured encoding and decoding using a low density parity check (LDPC) code, a parity check matrix used for encoding and decoding is stored in a type of a model matrix which includes a plurality of indexes, each of which indicates a specific sub-matrix. Each index of the model matrix is replaced with a corresponding sub-matrix during encoding or decoding is performed, whereby a parity check matrix is generated. In one aspect of the present invention, each index of the model matrix is expanded to an index matrix which includes two or more indexes. Each index included in the index matrix means a specific sub-matrix, and can be replaced with a corresponding sub-matrix to generate a parity check matrix.

BEST MODE FOR CARRYING OUT THE INVENTION

Hereinafter, structures, operations, and advantages of the present invention will be understood readily by the preferred embodiments of the present invention, examples of which are illustrated in the accompanying drawings.

Since the embodiments of the present invention are based on a method of encoding and decoding using a structured LDPC, a method of encoding and decoding using a structured LDPC will be described hereinafter.

A parity check matrix is used to use an LDPC code. As described above, the parity check matrix is a binary matrix and includes elements, most of which are '0' and some of which are '1.' Since the parity check matrix actually used for encoding or decoding has a size of $10^5$ bits or greater, a large-scaled memory is required to store the parity check matrix.

In a method of encoding using a structured LDPC, a parity check matrix is stored in a type of a model matrix. The model matrix includes a plurality of indexes, each of which indicates a specific sub-matrix. In other words, each sub-matrix is a matrix of a constant size (z×z) and is expressed by a specific index. Each index of the model matrix is replaced with a sub-matrix indicated by the corresponding index when encoding or decoding is performed, whereby the model matrix is used by being expanded to the parity check matrix.

Figure 1:
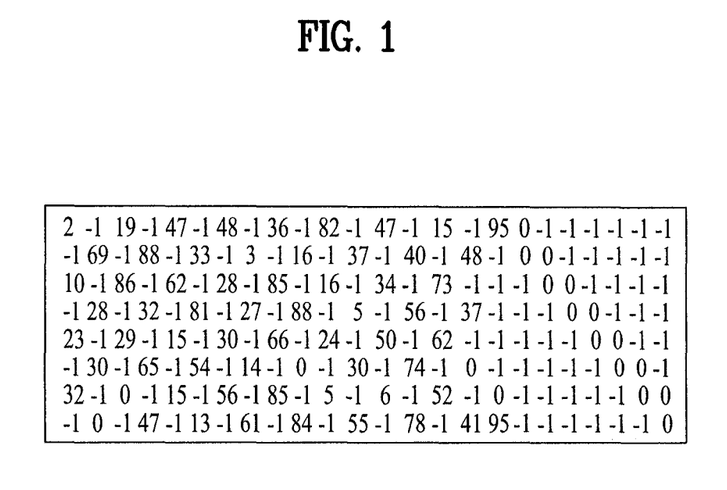
FIG. 1 is a diagram illustrating an example of a model matrix.

FIG. 1 is a diagram illustrating an example of the model matrix. In FIG. 1, each integer means an index of a corresponding sub-matrix. For example, if the index is equal to '−1,' a sub-matrix having the index of '−1' means a zero matrix of a specific size. If the index is equal to '0,' a sub-matrix having the index of '0' means an identity matrix of a specific size. Also, indexes excluding '−1' and '0,' which are positive integers, can mean a predetermined rule which generates a corresponding sub-matrix. For example, indexes which are positive integers represent shift values. In other words, supposing that each sub-matrix is a permutation matrix generated by shifting each row or column of the identity matrix in a constant direction, the shift value could be an index of the corresponding sub-matrix. For example, if a sub-matrix is expressed by an index of '1,' the corresponding sub-matrix is generated by shifting each row or column of the identity matrix by one space (row or column) in a specific direction. No index may be used in the model matrix, so as to express a sub-matrix which is a zero matrix.

In the embodiments which will be described later, no index is used to express a sub-matrix which is a zero matrix. In other words, a sub-matrix which is a zero matrix will be expressed as "NULL" in the mode matrix.

Figure 2:
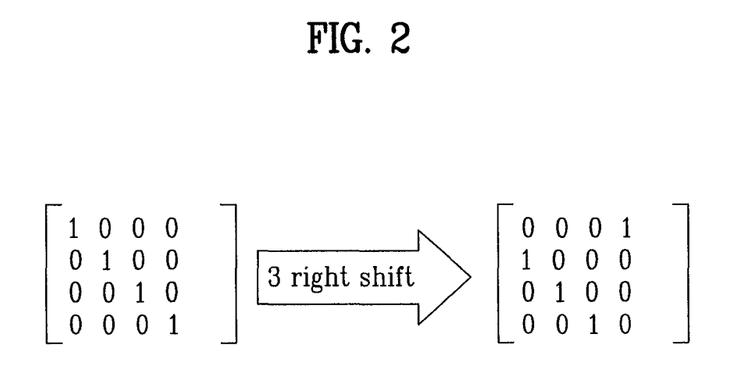
FIG. 2 is a diagram illustrating a method of expressing a matrix according to indexes.

FIG. 2 is a diagram illustrating a method of expressing a matrix according to the aforementioned indexes, i.e., shift values. When a specific parity check matrix is structured as a matrix (i.e., sub-matrix) of 4×4 size, a sub-matrix having an index of '3' becomes a permutation matrix generated by shifting each column of the identity matrix of 4×4 size to the right by three columns.

Memory capacity for storing the parity check matrix can be saved in such a manner that a model matrix obtained by expressing each sub-matrix by one index is stored in accordance with a structured LDPC scheme and a model matrix stored during encoding or decoding is expanded to its original parity check matrix.

Figure 3:
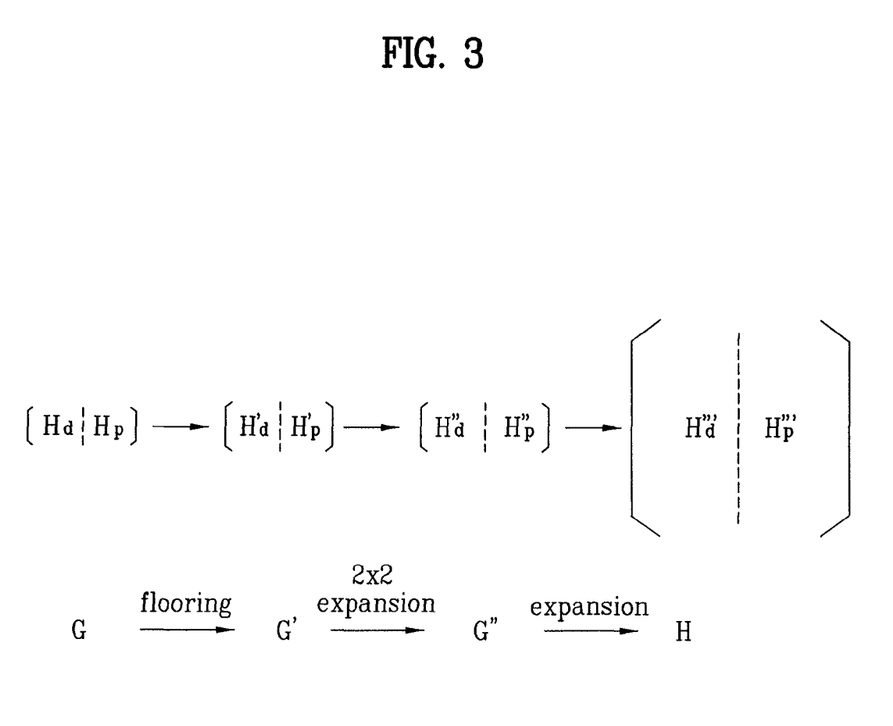
FIG. 3 is a diagram illustrating one embodiment according to the present invention.

FIG. 3 is a diagram illustrating one embodiment according to the present invention. The embodiment of FIG. 3 relates to an example of generating a parity check matrix H used for encoding or decoding through a flooring operation procedure and expansion procedures of two times based on a first model matrix G. In FIG. 3, although 'G' has been used as a symbol for expressing the first model matrix, it is to be understood that this 'G' is different from 'G' which means a generation matrix.

Referring to FIG. 3, flooring operation is performed for the first model matrix (G) to generate a second model matrix (G'). The flooring operation means an operation method for generating a second model matrix for a second sub-matrix of actual lifting order (for example, 5×5) from a first model matrix for a first sub-matrix of maximal lifting order (for example, 12×12), and can be expressed by the following equation 3.

$$\text{Shift}(z) = \text{floor}(\text{shift}(z_{max}) z / z_{max})$$ [Equation 3]

In the above equation, shift(z) means a shift value of the second sub-matrix, and floor(x) means an integer most approximate from x to minus infinity direction.

In other words, if each element of the first mode matrix is configured by an index (for example, if each row or column of a base permutation matrix is shifted in a given direction, the index means a shift value) indicating the first sub-matrix of $z_{max} \times z_{max}$ dimension, it is necessary to generate a second model matrix of which elements are configured by indexes indicating a second sub-matrix of z×z dimension. At this time, each element of the first model matrix can be replaced with each element of the second model matrix using the equation 3.

For example, a second sub-matrix, which is formed by mapping a first sub-matrix for an identity matrix of 5×5 dimension, can be obtained as illustrated in the following equation 4 in accordance with the equation 3. In this case, the first sub-matrix is formed by shifting each row or column of an identity matrix of 12×12 dimension by '7' in a specific direction.

$$\text{shift}(5) = \text{floor}(\text{shift}(12) \times 5 \div 12) = \text{floor}(7 \times 5 \div 12) = \text{floor}(2.92) = 2$$ [Equation 4]

In other words, the first sub-matrix, which is formed by shifting each row or column of an identity matrix of 12×12 dimension by '7' in a specific direction, is mapped with the second matrix which is formed by shifting each row or column of an identity matrix of 5×5 dimension by '2' in a specific direction.

In this way, element values of the first model matrix can be replaced with element values of the second model matrix to generate the second model matrix. In this case, the second model matrix has the same size as that of the first model matrix. Also, the location of "NULL" in the first model matrix, i.e., index indicating a zero matrix becomes "NULL" even in the second model matrix. When this is implemented in hardware or software, the 'floor' operation can make complexity very simple. Alternatively, modulo operation may be performed for each index of the first model matrix when the second model matrix is generated from the first model matrix.

In FIG. 3, the 2×2 expansion procedure means that a third model matrix (G") is generated by expanding each element (index or shift value) of the second model matrix (G') to an index matrix of 2×2 dimension.

Figure 4:
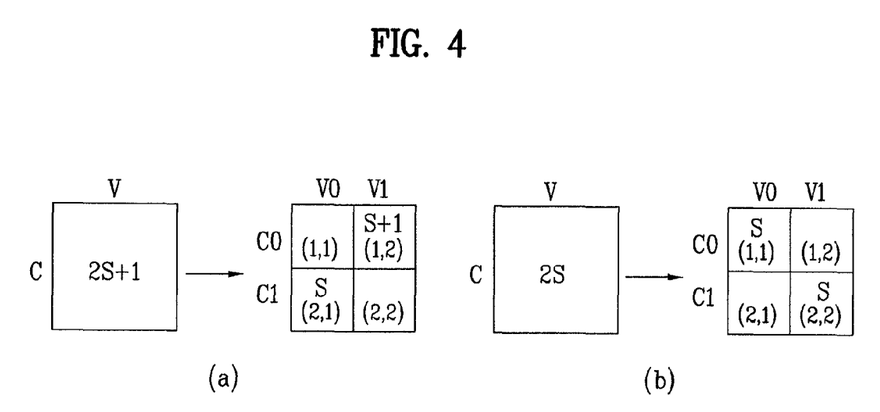
FIG. 4 is a diagram illustrating an example of a 2×2 expansion scheme.

FIG. 4 is a diagram illustrating an example of a 2×2 expansion method. FIG. 4(a) illustrates a 2×2 expansion method when a specific index of the second model matrix is an odd number, and FIG. 4(b) illustrates a 2×2 expansion method when a specific index of the second model matrix is an even number. Each sub-matrix of the second model matrix (G') is expanded to four sub-matrixes in the third model matrix (G") by the 2×2 expansion. In this case, since each sub-matrix of the third model matrix (G") has a size of ½ of each sub-matrix of the second model matrix (G'), the whole size of the second model matrix (G') becomes the same as that of the third model matrix (G"). For example, a sub-matrix having a size of 1024 is expanded to four sub-matrixes each having a size of 512.

Hereinafter, the first to third model matrixes will be compared with one another in view of size. It is supposed that that the number of columns in the first model matrix is n, the number of rows in the first model matrix is (n−k), and each sub-matrix has a $z_{max} \times z_{max}$ dimension. In this case, the number of columns in the second model matrix and the number of rows in the second model matrix are the same as those in the first model matrix, and each sub-matrix included in the second model matrix has a z×z dimension. Also, the number of columns in the third model matrix becomes n×2, the number of rows in the second model matrix is (n−k)×2, and each sub-matrix included in the third model matrix has a z/2×z/2 dimension.

In this specification, "index matrix" means a matrix generated as one index is expanded by the 2×2 expansion method according to the embodiment of the present invention. As shown in FIG. 4, the index matrix can include two indexes and two "NULL" elements.

As shown in FIG. 4(a), when a specific element of the second model matrix, i.e., a specific index is an odd number (2S+1, S is an integer larger than 0), a corresponding sub-matrix is expanded to a cross diagonal structure type of 2×2 dimension. In other words, each sub-matrix of the second model matrix is expanded to four sub-matrixes. At this time, among the four sub-matrixes, the sub-matrixes in (1, 1) and (2, 2) locations are zero matrixes, index of the sub-matrix in (1, 2) location is (S+1), and index of the sub-matrix in (2, 1) location is S.

In FIG. 4(b), when a specific element of the second model matrix, i.e., a specific index is an even number (2S, S is an integer larger than 0), a corresponding sub-matrix is expanded to a diagonal structure type of 2×2 dimension. In other words, as shown in FIG. 4(b), indexes of the sub-matrixes in (1, 1) and (2, 2) locations are S, and the sub-matrixes in (1, 2) and (2, 1) locations are zero matrixes. When an index of a sub-matrix in the second model matrix is equal to '0,' it means that the corresponding sub-matrix is an identity matrix. In this case, the index is expanded in accordance with the example of FIG. 4(b). When a specific sub-matrix of the second model matrix is a zero matrix, the corresponding sub-matrix is expanded to four zero matrixes of ½ size by the 2×2 expansion procedure. The sub-matrix which is a zero matrix included in the first model matrix and the second model matrix can be expressed as "NULL." In this case, an element (NULL) of which index is not expressed in the first model matrix or the second model matrix indicates a zero matrix.

Figure 5:
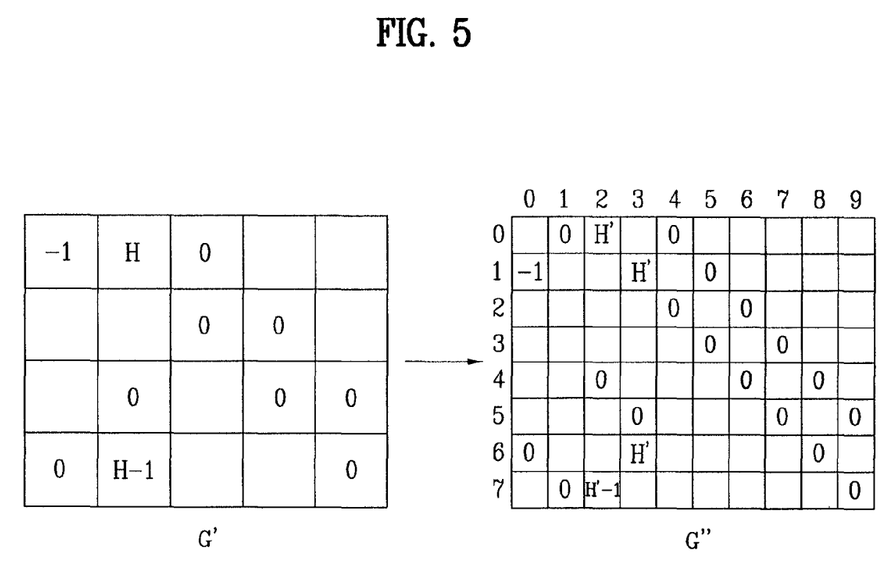
FIG. 5 is a diagram illustrating an example of a method of generating a third model matrix by performing a 2×2 expansion for a second model matrix (G') in accordance with the embodiment of FIG. 4.

FIG. 5 is a diagram illustrating an example of a method of generating a third model matrix (G") by performing a 2×2 expansion for a second model matrix (G') in accordance with the embodiment of FIG. 4. It is noted that the second model matrix (G') having 4×5 sub-matrixes is expanded to the third model matrix (G") having 8×10 sub-matrixes. In this case, each sub-matrix of the third model matrix (G") has a size of ½ of that of each sub-matrix of the second model matrix (G'). In FIG. 5, '−1' means index of (maximum shift size −1). For example, since the maximum shift size is 1024 when the sub-matrix has a size of 1024, an index of '−1' has same meaning of an index of '1023.'

Figure 6A:
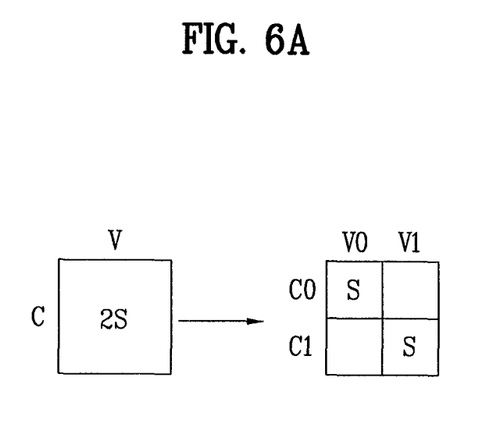
FIG. 6a and FIG. 6b are diagrams illustrating examples of 2×2 expansion methods in accordance with another embodiment of the present invention.
Figure 6B:
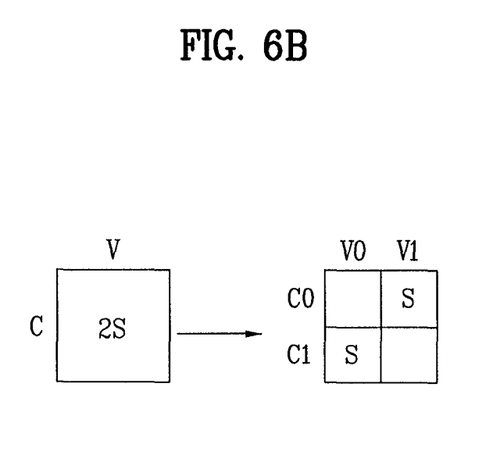
Figure 7A:
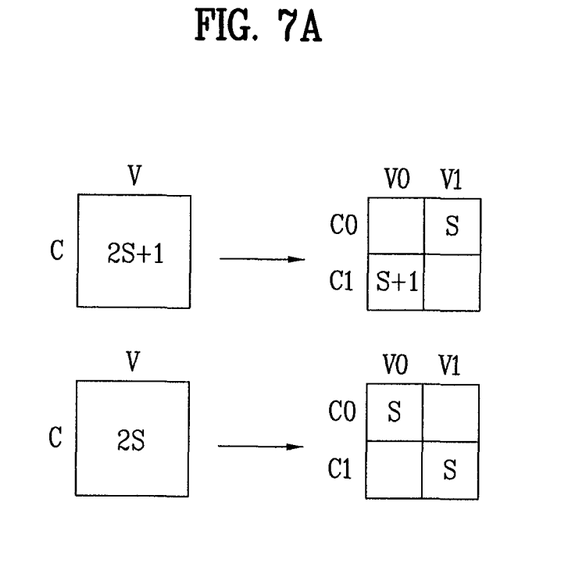
FIG. 7a to FIG. 7g are diagrams illustrating examples of 2×2 expansion methods in accordance with another embodiment of the present invention.
Figure 7B:
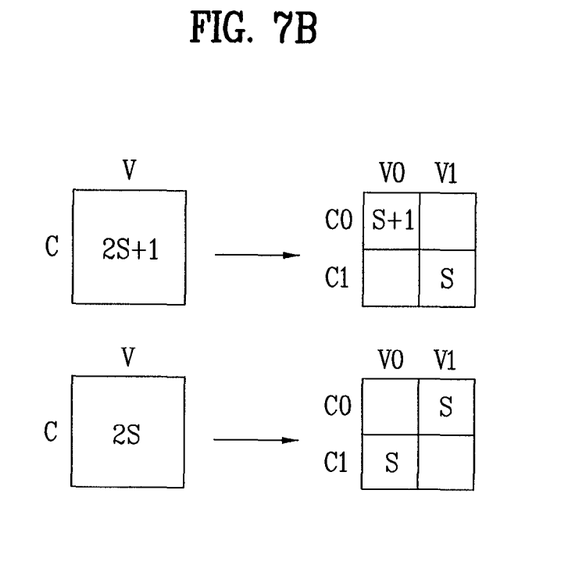
Figure 7C:
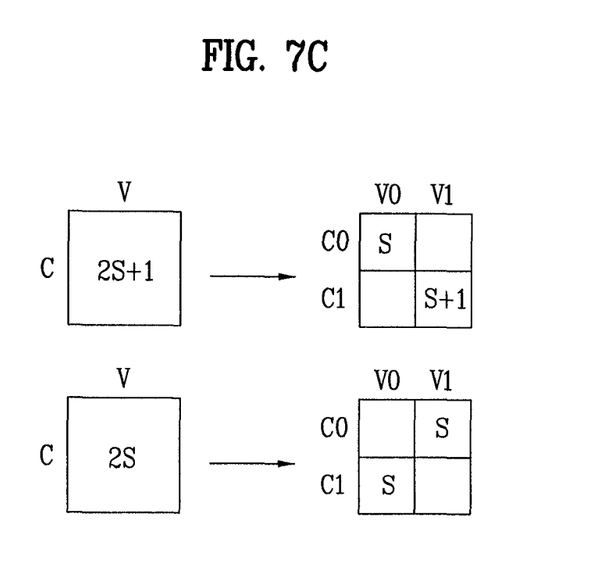
Figure 7D:
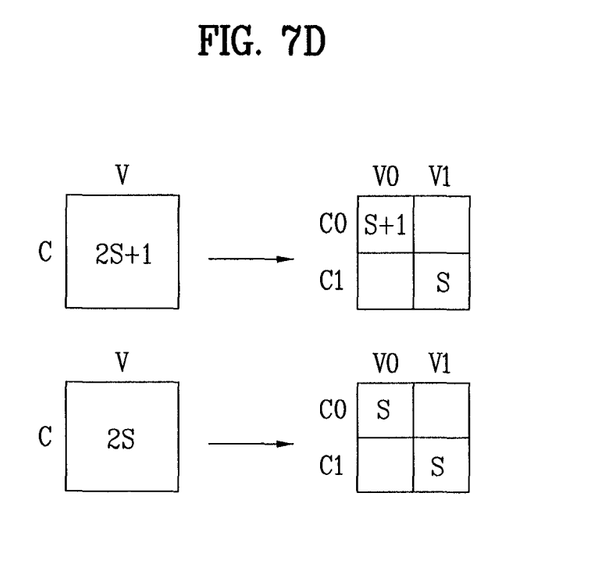
Figure 7E:
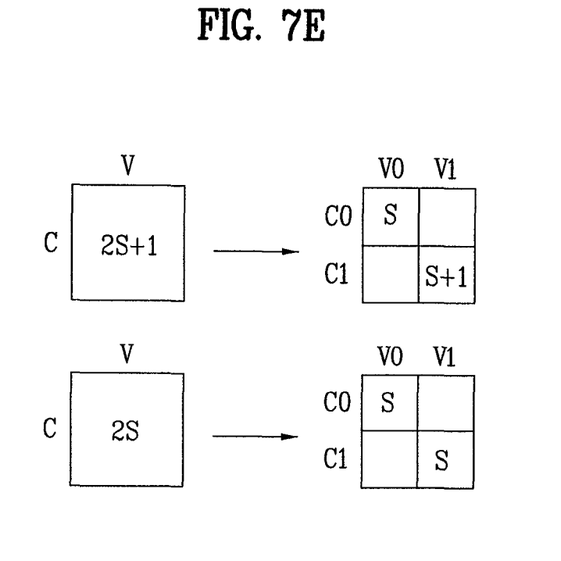
Figure 7F:
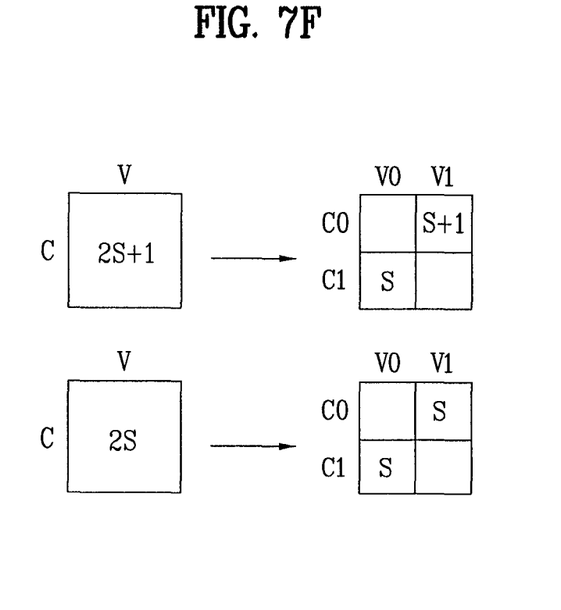
Figure 7G:
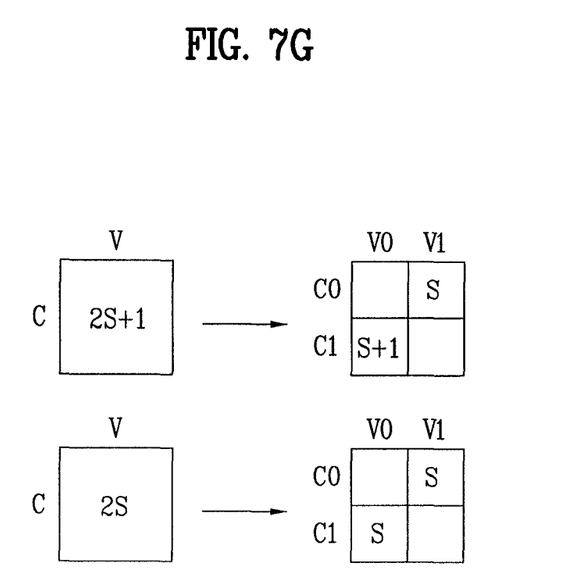

FIG. 6a and FIG. 6b are diagrams illustrating examples of 2×2 expansion methods in accordance with another embodiment of the present invention. In FIG. 6a, the specific sub-matrix of the second model matrix is expanded to a diagonal structure type regardless of odd number index or even number index. In FIG. 6b, the specific sub-matrix of the second model matrix is expanded to a cross diagonal structure type.

FIG. 7a to FIG. 7g are diagrams illustrating examples of 2×2 expansion methods in accordance with another embodiment of the present invention. In FIG. 7a to FIG. 7g, the 2×2 expansion method is varied depending on whether index of the specific sub-matrix of the second model matrix is an odd number (2S+1) or an even number (2S). In the examples of FIG. 7a to FIG. 7g, the specific sub-matrix is expanded to a diagonal structure or a cross diagonal structure. The detailed description of each of the 2×2 expansion methods can be referred to the embodiment of FIG. 4.

Figure 8A:
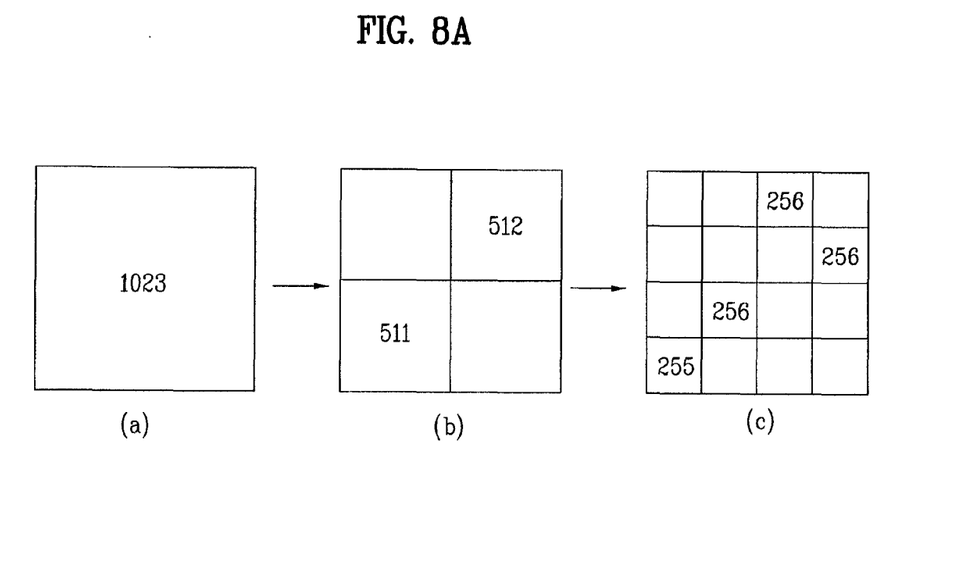
FIG. 8a and FIG. 8b are diagrams illustrating examples of a method of repeating a 2×2 expansion in accordance with one embodiment of the present invention.
Figure 8B:
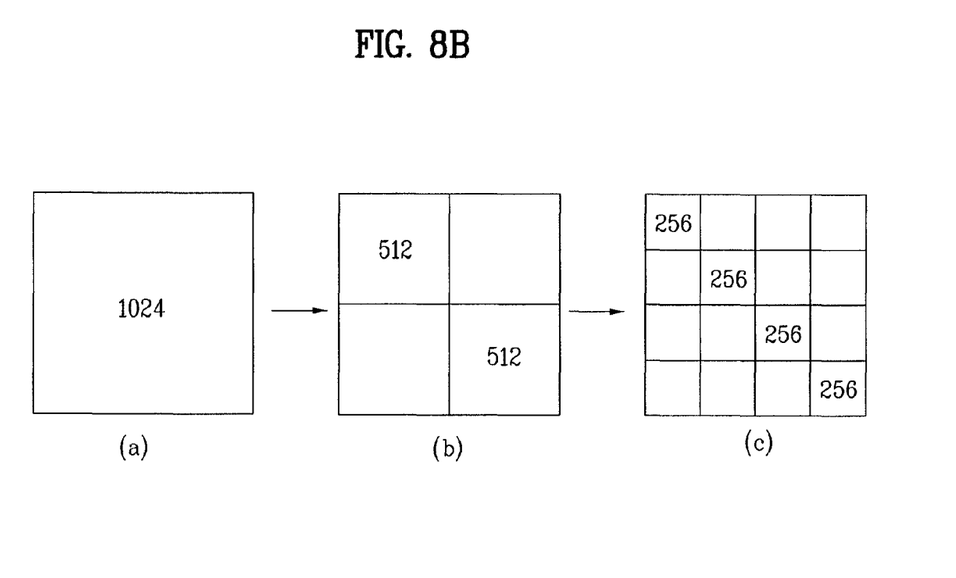

FIG. 8a and FIG. 8b are diagrams illustrating examples of a method of repeating 2×2 expansion in accordance with one embodiment of the present invention. In FIG. 8a, a sub-matrix (a) of which index is 1023 is expanded to a cross diagonal structure of 2×2 as shown in (b) in accordance with the example of FIG. 4(a), and each sub-matrix of (b) is again expanded to 2×2 to obtain a matrix of a structure shown in (c) In FIG. 8b, a sub-matrix (a) of which index is 1024 is expanded to a diagonal structure of 2×2 as shown in (b) in accordance with the example of FIG. 4(b), and each sub-matrix of (b) is again expanded to 2×2 to obtain a matrix of a structure shown in (c). In other words, the 2×2 expansion is repeated twice. It will be apparent that the 2×2 expansion can be repeated three times or greater. In FIG. 8A and FIG. 8B, the sub-matrix (a) has a size of 1024, the sub-matrix (b) has a size of 512, and the sub-matrix (c) has a size of 256.

Referring to FIG. 3 again, the third model matrix (G") generated by the 2×2 expansion is expanded to a parity check matrix. In other words, each element of the third model matrix is replaced with a sub-matrix indicated by a corresponding index to generate a parity check matrix used for encoding or decoding. In more detail, a specific element having index of '0' of the third model matrix is replaced with an identity matrix of z×z dimension, and a specific element having index of a positive integer is replaced with a permutation matrix formed by shifting each row or column of the identity matrix by the positive integer. The sub-matrix of the third model matrix which is a zero matrix is replaced with a zero matrix of z×z dimension. Accordingly, the generated parity check matrix becomes a binary matrix which includes elements "0" and "1."

In FIG. 3, the order of the flooring procedure and the 2×2 expansion procedure can be changed. In other words, after the first mode matrix (G) is expanded in accordance with the aforementioned 2×2 expansion method to generate the second model matrix, flooring operation may be performed for each element of the generated second model matrix, i.e., each index, to generate the third model matrix. The third model matrix becomes a parity check matrix by means of expansion.

In FIG. 3, before encoding or decoding is performed for the parity check matrix generated by expansion of the third model matrix, a permutation procedure of rows and/or columns can be performed.

Figure 9:
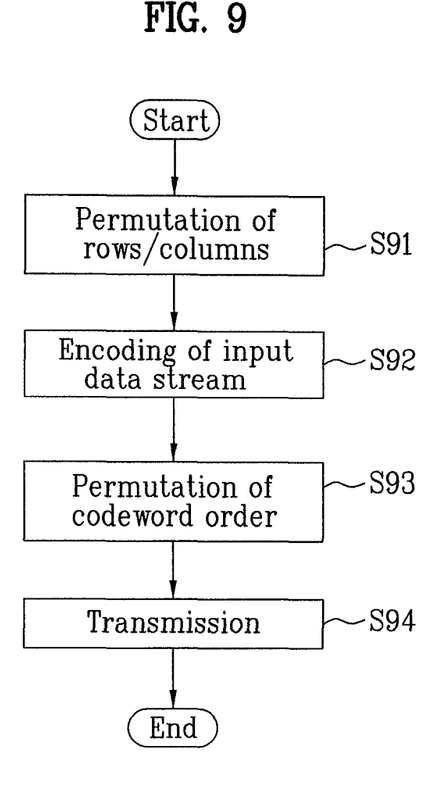
FIG. 9 is a flow chart illustrating a permutation procedure of rows/columns and an encoding procedure of a transmitter in a communication system through a parity check matrix.

FIG. 9 is a flow chart illustrating a permutation procedure of rows/columns and an encoding procedure of a transmitter in a communication system through a parity check matrix.

Referring to FIG. 9, permutation is applied to either at least one row or column of the parity check matrix, or at least one row and column of the parity check matrix, so as to generate a final parity check matrix having at least one part of a standard structure for encoding of input data columns (S91).

In general, the parity check matrix H can be expressed as H=[$H_d|H_p$] ($H_d$ is (n−k)×k dimension, and $H_p$ is (n−k)×(n−k) dimension). $H_d$ is an information part, and $H_p$ is a parity part. Also, k means a length (bit unit) of input data columns, and n means a length (bit unit) of encoded codeword (c).

Preferably, the parity part $H_p$ has a substantial dual diagonal structure. The dual diagonal structure means a matrix of which main diagonal elements and diagonal elements under or above the main diagonal elements are all 1 and the other elements are 0. The substantial dual diagonal structure means that, although not the perfect dual diagonal structure, the parity part $H_p$ has a structure almost similar to the dual diagonal structure. Accordingly, it is preferable that permutation is applied to rows and/or columns in the permutation procedure (S91) in order that the parity part $H_p$ of the parity check matrix has the substantial dual diagonal structure.

Meanwhile, the permutation procedure of rows/columns is performed for any one or two or more of the first model matrix (G), the second model matrix (G') and the third model matrix (G") so that the parity part of the parity check matrix finally has a standard structure such as the dual diagonal structure. Moreover, it is preferable that the first column of the parity part of the final parity check matrix has a weight of 3 through the permutation procedure (S91) of rows and/or columns.

Figure 10:
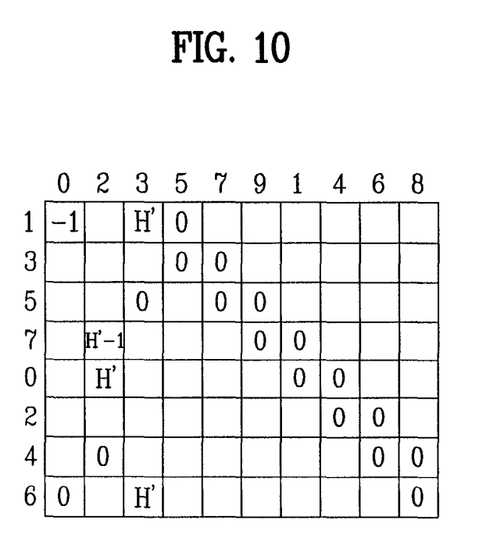
FIG. 10 is a diagram illustrating an example of forming a dual diagonal structure in a parity part by performing a row/column permutation procedure for a third model matrix (G") of FIG. 5.

FIG. 10 is a diagram illustrating an example of forming a fourth model matrix (G''') of a dual diagonal structure in a parity part by performing a row/column permutation procedure for the third model matrix (G") of FIG. 5. In this case, the final parity check matrix is generated by replacing each index of the fourth model matrix (G''') with a corresponding sub-matrix.

In order to generate the fourth model matrix (G''') from the third model matrix (G"), a row permutation pattern for permutation of rows and a column permutation pattern for permutation of columns are previously determined, and the row permutation pattern and the column permutation pattern are applied to the third model matrix (G"), whereby the fourth model matrix (G''') can easily be generated.

If the final parity check matrix is generated, input data columns are encoded (S93).

As described above, in the method of encoding using LDPC code, input source data can be encoded using a generator matrix. In other words, input source data $s_{1 \times k}$ of k bit are encoded in the generator matrix to obtain a codeword $x_{1 \times k}$ of n bit. The codeword x has a configuration of x=[s p]= [$s_0, s_1, \ldots, s_{k-1}, p_0, p_1, \ldots, p_{m-1}$], wherein ($p_0, p_1, \ldots, p_{m-1}$) are parity check bits, and ($s_0, s_1, \ldots, s_{k-1}$) are systematic bits.

However, the encoding method using the generator matrix is very complicate. Accordingly, in order to reduce such complexity, it is preferable to directly encode input source data by using the parity check matrix H without through the generator matrix. In other words, since x=[s p], H·x=H·[s p]=0 is obtained using a feature of H·x=0. Since the parity check bit p can be obtained from the equation H·x=H·[s p]=0, the codeword x=[s p] can be obtained.

Next, de-permutation is applied to the order of symbols constituting the codeword encoded by the parity check matrix (S95). At this time, de-permutation is performed in such a manner that the order of symbols constituting the codeword corresponds to the order of columns of the final parity check matrix corresponding to the case where permutation is not applied to the columns in the row/column permutation procedure (S91). In other words, if de-permutation is applied to the symbols of the codeword, the order of the symbols becomes a reverse order of the permutation order of columns configured in the row/column permutation procedure (S91).

In the LDPC encoding method, if encoding is performed for k input data columns by the parity check matrix of (n−k)×n, the codeword configured by n symbols is output. In other words, the number (n) of symbols constituting the codeword is the same as the number of columns of the parity check matrix, and the order of the symbols constituting the codeword corresponds to the order of columns of the parity check matrix.

If permutation is applied to columns in accordance with the row/column permutation procedure to obtain a predetermined part (for example, parity part) of the parity check matrix in a standard structure, permutation is also applied to the order of the symbols of the encoded codeword. Accordingly, it is necessary that permutation is applied to the order of the codeword symbols, to which permutation has been applied, so as to correspond to the columns of the parity check matrix before permutation. It is possible to efficiently support a retransmission scheme such as ARQ or HARQ through permutation of the order of the codeword.

If encoding using the parity check matrix is performed by the transmitter, the transmitter transmits the codeword, to which permutation has been applied, to the receiver (S97). A data processing procedure required in a communication system, such as rate matching, interleaving, and modulation, can be performed through the transmission procedure of the codeword.

When the receiver receives the codeword from the transmitter and decodes the received codeword, the receiver generates the parity check matrix in accordance with the method of generating a parity check matrix according to the embodiment of the present invention and decodes the received codeword by using the generated parity check matrix.

Terminologies used herein can be replaced with other terminologies having the same meaning. For example, the model matrix can be replaced with 'base matrix' or 'base parity check matrix,' and the sub-matrix can be replaced with 'permutation matrix.'

The aforementioned embodiments are achieved by combination of structural elements and features of the present invention in a predetermined type. Each of the structural elements or features should be considered selectively unless specified separately. Each of the structural elements or features may be carried out without being combined with other structural elements or features. Also, some structural elements and/or features may be combined with one another to constitute the embodiments of the present invention. The order of operations described in the embodiments of the present invention may be changed. Some structural elements or features of one embodiment may be included in another embodiment, or may be replaced with corresponding structural elements or features of another embodiment. Moreover, it will be apparent that some claims referring to specific claims may be combined with another claims referring to the other claims other than the specific claims to constitute the embodiment or add new claims by means of amendment after the application is filed.

The embodiments according to the present invention may be implemented by various means, for example, hardware, firmware, software, or their combination. If the embodiment according to the present invention is implemented by hardware, the embodiment of the present invention may be implemented by one or more application specific integrated circuits (ASICs), digital signal processors (DSPs), digital signal processing devices (DSPDs), programmable logic devices (PLDs), field programmable gate arrays (FPGAs), processors, controllers, microcontrollers, microprocessors, etc.

If the embodiment according to the present invention is implemented by firmware or software, the method of transmitting and receiving data in the wireless communication system according to the embodiment of the present invention may be implemented by a type of a module, a procedure, or a function, which performs functions or operations described as above. A software code may be stored in a memory unit and then may be driven by a processor. The memory unit may be located inside or outside the processor to transmit and receive data to and from the processor through various means which are well known.

According to the embodiments of the present invention, the following advantages can be obtained.

First of all, it is possible to control weight distribution and the number of cycles such as 4-cycle and 6-cycle by expanding the model matrix in accordance with index of each sub-matrix when the parity check matrix is generated from the model matrix.

Second, it is possible to enhance efficiency during parallel encoding and decoding by using two separate permutation matrixes through 2×2 expansion.

Third, it is possible to efficiently perform parallel processing during encoding or decoding through the method of expanding each index included in the model matrix to an index matrix of 2×2 dimension of a diagonal or cross diagonal type.

It will be apparent to those skilled in the art that the present invention can be embodied in other specific forms without departing from the spirit and essential characteristics of the invention. Thus, the above embodiments are to be considered in all respects as illustrative and not restrictive. The scope of the invention should be determined by reasonable interpretation of the appended claims and all change which comes within the equivalent scope of the invention are included in the scope of the invention.

INDUSTRIAL APPLICABILITY

The present invention can be applied to every field where encoding and decoding are used, as well as a wireless communication system such as a mobile communication system or a wireless Internet system.

The invention claimed is:

1. A method of generating a parity check matrix for performing encoding using a low density parity check (LDPC) code, comprising:

generating, by a transmitting device, a second model matrix by replacing each index "shift($z_{max}$)" of a first model matrix which includes a plurality of indexes, each of which is "−1" indicating a $z_{max} \times z_{max}$ zero matrix, "0" indicating a $z_{max} \times z_{max}$ identity matrix or "positive integer" indicating a permutation matrix generated by shifting each row or column of the $z_{max} \times z_{Max}$ identity matrix by a same number of rows or columns as the "positive integer", with another index "shift(z)" indicating a z×z sub-matrix according to a following equation:

$$\text{shift}(z) = \text{floor}(\text{shift}(z_{max}) z / z_{max}),$$

where "floor(x)" corresponds to an integer most approximate from x to a minus infinity direction;

generating, by the transmitting device, a third model matrix by replacing each non-negative integer index, hereinafter referred to as "X", of the second model matrix, with a 2×2 cross diagonal index matrix $$\begin{bmatrix} 0 & a_{1,2} \\ a_{2,1} & 0 \end{bmatrix}$$

where $a_{1,2} + a_{2,1} = X$ or with a 2×2 diagonal matrix $$\begin{bmatrix} a_{1,1} & 0 \\ 0 & a_{2,2} \end{bmatrix}$$

where $a_{1,1} + a_{2,2} = X$ according to whether "X" is an odd number "2S+1" or an even number "2S", where "S" is equal to or larger than "0"; and replacing each index "−1" of the second model matrix with a 2×2 matrix consisting of indexes which indicate zero sub matrixes;

encoding, by the transmitting device, input data by using the third model matrix; and transmitting, by the transmitting device, the encoded data to a receiving device.

2. The method of claim 1, wherein when "X" is "2S+1", "X" is replaced with $$\begin{bmatrix} 0 & a_{1,2} = S+1 \\ a_{2,1} = S & 0 \end{bmatrix},$$

and when "X" is "2S", "X" is replaced with $$\begin{bmatrix} a_{1,1} = S & 0 \\ 0 & a_{2,2} = S \end{bmatrix}.$$

3. The method of claim 1, wherein when "X" is "2S+1", "X" is replaced with $$\begin{bmatrix} 0 & a_{1,2} = S \\ a_{2,1} = S+1 & 0 \end{bmatrix},$$

and when "X" is "2S", "X" is replaced with $$\begin{bmatrix} a_{1,1} = S & 0 \\ 0 & a_{2,2} = S \end{bmatrix}.$$

4. The method of claim 1, wherein
when "X" is "2S+1", "X" is replaced with $$\begin{bmatrix} a_{1,1} = S+1 & 0 \\ 0 & a_{2,2} = S \end{bmatrix},$$

and
when "X" is "2S", "X" is replaced with $$\begin{bmatrix} 0 & a_{1,2} = S \\ a_{2,1} = S & 0 \end{bmatrix}.$$

5. The method of claim 1, wherein
when "X" is "2S+1", "X" is replaced with $$\begin{bmatrix} a_{1,1} = S & 0 \\ 0 & a_{2,2} = S+1 \end{bmatrix},$$

and
when "X" is "2S", "X" is replaced with $$\begin{bmatrix} 0 & a_{1,2} = S \\ a_{2,1} = S & 0 \end{bmatrix}.$$

6. The method of claim 1, wherein
when "X" is "2S+1", "X" is replaced with $$\begin{bmatrix} a_{1,1} = S+1 & 0 \\ 0 & a_{2,2} = S \end{bmatrix},$$

and
when "X" is "2S", "X" is replaced with $$\begin{bmatrix} a_{1,1} = S & 0 \\ 0 & a_{2,2} = S \end{bmatrix}.$$

7. The method of claim 1, wherein
when "X" is "2S+1", "X" is replaced with $$\begin{bmatrix} a_{1,1} = S & 0 \\ 0 & a_{2,2} = S+1 \end{bmatrix},$$

and
when "X" is "2S", "X" is replaced with $$\begin{bmatrix} a_{1,1} = S & 0 \\ 0 & a_{2,2} = S \end{bmatrix}.$$

8. The method of claim 1, wherein
when "X" is "2S+1", "X" is replaced with $$\begin{bmatrix} 0 & a_{1,2} = S+1 \\ a_{2,1} = S & 0 \end{bmatrix},$$

and
when "X" is "2S", "X" is replaced with $$\begin{bmatrix} 0 & a_{1,2} = S \\ a_{2,1} = S & 0 \end{bmatrix}.$$

9. The method of claim 1, wherein
when "X" is "2S+1", "X" is replaced with $$\begin{bmatrix} 0 & a_{1,2} = S \\ a_{2,1} = S+1 & 0 \end{bmatrix},$$

and
when "X" is "2S", "X" is replaced with $$\begin{bmatrix} 0 & a_{1,2} = S \\ a_{2,1} = S & 0 \end{bmatrix}.$$

10. A method of generating a parity check matrix for performing decoding using a low density parity check (LDPC) code, comprising:

generating, by a receiving device, a second model matrix by replacing each index "shift $(z_{max})$" of a first model matrix, the first model matrix including a plurality of indexes, each index of the plurality of indexes being one of "−1" indicating a $z_{max} \times z_{max}$ zero matrix, "0" indicating a z×z identity matrix or "positive integer" indicating a $z_{max} \times z_{max}$ permutation matrix generated by shifting each row or column of the $z_{max} \times z_{max}$ identity matrix by the same number of rows or columns as the "positive integer", with another index "shift(z)" indicating a z×z sub-matrix according to a following equation:

shift(z)=floor(shift($z_{max}$)z/$z_{max}$)

where "floor(x)" corresponds to an integer most approximate from x to minus infinity direction;

generating, by the receiving device, a third model matrix by replacing each non-negative integer index, hereinafter referred to as "X", of the first second matrix with a 2×2 cross diagonal matrix $$\begin{bmatrix} 0 & a_{1,2} \\ a_{2,1} & 0 \end{bmatrix}$$

where $a_{1,2}+a_{2,1}$=X or with a 2×2 diagonal matrix $$\begin{bmatrix} a_{1,1} & 0 \\ 0 & a_{2,2} \end{bmatrix}$$

where $a_{1,1}+a_{2,2}$=X according to whether "X" is an odd number "2S+1" or an even number "2S" where "S" is equal to or larger than "0" and replacing each index "−1" of the second model matrix with a 2×2 matrix consisting of indexes which indicate zero sub matrixes; and decoding, by the receiving device, encoded data received from a transmitting device using the third model matrix.

\* \* \* \* \*